(12) United States Patent
Nagasawa et al.

(10) Patent No.: US 11,166,377 B2
(45) Date of Patent: Nov. 2, 2021

(54) METHOD OF CUTTING ELECTRONIC COMPONENT, METHOD OF REMOVING COMPONENT, AND METHOD OF MANUFACTURING ELECTRONIC DEVICE

(71) Applicant: Kioxia Corporation, Tokyo (JP)

(72) Inventors: Kazuya Nagasawa, Kamakura (JP); Norihiro Ishii, Akishima (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/016,848

(22) Filed: Sep. 10, 2020

(65) Prior Publication Data
US 2021/0282267 A1    Sep. 9, 2021

(30) Foreign Application Priority Data
Mar. 6, 2020   (JP) .............................. JP2020-039113

(51) Int. Cl.
*H05K 3/00* (2006.01)
(52) U.S. Cl.
CPC ... *H05K 3/0044* (2013.01); *H05K 2203/0228* (2013.01); *H05K 2203/0235* (2013.01); *H05K 2203/176* (2013.01)
(58) Field of Classification Search
CPC ...... H05K 3/0044; H05K 3/078; H05K 3/223; H05K 2203/176; H05K 2203/0228; H05K 2203/0235; Y10T 29/49128; Y10T 29/49155; Y10T 29/49718; Y10T 29/49815

USPC ........................... 29/831, 846, 402.01, 426.1
See application file for complete search history.

(56) References Cited

U.S. PATENT DOCUMENTS

| 4,605,344 | A | * | 8/1986 | Hartmann | ............ | H05K 3/0047 |
| | | | | | | 408/1 R |
| 5,507,603 | A | | 4/1996 | Nakano et al. | | |
| 5,519,579 | A | * | 5/1996 | Fink | ........................ | H05K 3/225 |
| | | | | | | 29/830 |
| 5,782,403 | A | * | 7/1998 | Wang | .................. | H05K 13/0486 |
| | | | | | | 29/762 |
| 5,785,465 | A | | 7/1998 | Korbonski | | |

FOREIGN PATENT DOCUMENTS

| JP | 7-96499 A | 4/1995 |
| JP | 2010-27685 A | 2/2010 |
| JP | 2013-247135 A | 12/2013 |

* cited by examiner

*Primary Examiner* — Donghai D Nguyen
(74) *Attorney, Agent, or Firm* — Oblon, McClelland, Maier & Neustadt, L.L.P.

(57) ABSTRACT

A method of cutting an electronic component mounted on a circuit board includes: a step of applying adhesive to a predetermined area including at least an outermost peripheral portion of an upper surface of the electronic component and attaching a dustproof sheet to the upper surface of the electronic component; and a step of cutting the electronic component while maintaining a state where the dustproof sheet is attached to the outermost peripheral portion.

20 Claims, 7 Drawing Sheets

METHOD OF CUTTING ELECTRONIC COMPONENT, METHOD OF REMOVING COMPONENT, AND METHOD OF MANUFACTURING ELECTRONIC DEVICE

CROSS-REFERENCE TO RELATED APPLICATIONS

This application is based upon and claims the benefit of priority from Japanese Application No. 2020-039113, filed on Mar. 6, 2020, the entire contents of which are incorporated herein by reference.

FIELD

Embodiments described herein relate generally to a method of cutting an electronic component, a method of removing a component, and a method of manufacturing an electronic device.

BACKGROUND

When an electronic component such as a semiconductor package mounted on a printed circuit board is determined to be defective during inspection or becomes defective during use, a rework (repair) process is performed to replace the electronic component with a good product.

In this rework process, the component to be removed such as the semiconductor package mounted on the printed circuit board is removed from the printed circuit board by heating or cutting.

A cutting process using a cutting device is selected when heat by a heating process may cause damage to a component arranged around a target component.

In the cutting process, a large amount of cutting debris (or, swarf) is generated, and the cutting debris may remain on a surface of the printed circuit board or enter a gap between the surface of the printed circuit board and a lower surface side of a mounted component such as a semiconductor package.

A printed circuit board having under fill (UF) can avoid such a problem.

However, on a printed circuit board having no under fill, cutting debris may enter a gap between a surface of the printed circuit board and a lower surface side of a mounted semiconductor package. This may cause a defect such as short circuit, and a problem that it is difficult to ensure the reliability of an electronic device that includes such a printed circuit board.

Further, even on a printed circuit having the under fill, cutting debris may adhere to a surface of the printed circuit board or a surface of a mounted component such as a semiconductor package. As a result, if the removal of the cutting debris is incomplete, the reliability of the electronic device may lower similarly.

A problem to be solved by an embodiment is to provide a method of cutting an electronic component capable of preventing cutting debris from remaining on a surface of a printed circuit board or entering a gap between the surface of the printed circuit board and a lower surface side of a component such as a semiconductor package, a method of removing the electronic component, and a method of manufacturing an electronic device.

DETAILED DESCRIPTION

Next, an embodiment will be described in detail with reference to the drawings. In the following description, a semiconductor package will be mentioned as an example of an electronic component.

In general, according to one embodiment, a method of cutting an electronic component mounted on a circuit board includes: a step of applying adhesive to a predetermined area including at least an outermost peripheral portion of an upper surface of the electronic component, and attaching a dustproof sheet to the upper surface of the electronic component; and a step of cutting the electronic component while maintaining a state where the dustproof sheet is attached to the outermost peripheral portion.

Figure 1:
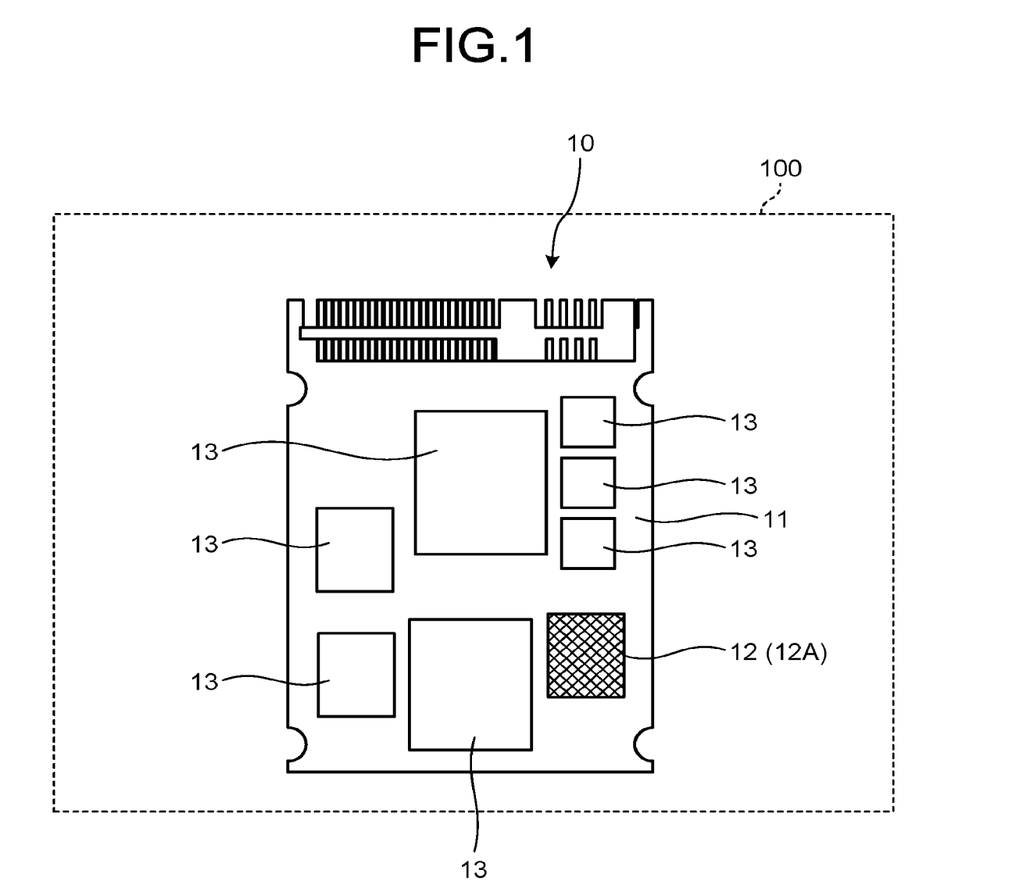
FIG. 1 illustrates an example of an electronic circuit board according to an embodiment on which a semiconductor package to be cut (removed) is placed.

FIG. 1 illustrates an example of an electronic circuit board according to the embodiment on which a semiconductor package to be cut (removed) is placed.

The electronic circuit board 10 includes a printed circuit board (PCB) 11, a semiconductor package 12 to be cut (removed) (illustrated by hatching in FIG. 2), and a semiconductor package 13 not to be cut. The semiconductor package 12 is a package that seals a NAND flash memory chip, for example. The electronic circuit board 10 is mounted on an electronic device 100. The electronic device 100 is, for example, a solid state drive (SSD).

The following description will be given by assuming that no under fill is provided between any of the semiconductor packages 12 or 13 and the printed circuit board 11, and the semiconductor package 12 to be cut is a ball grid array (BGA) semiconductor package.

Figure 2:
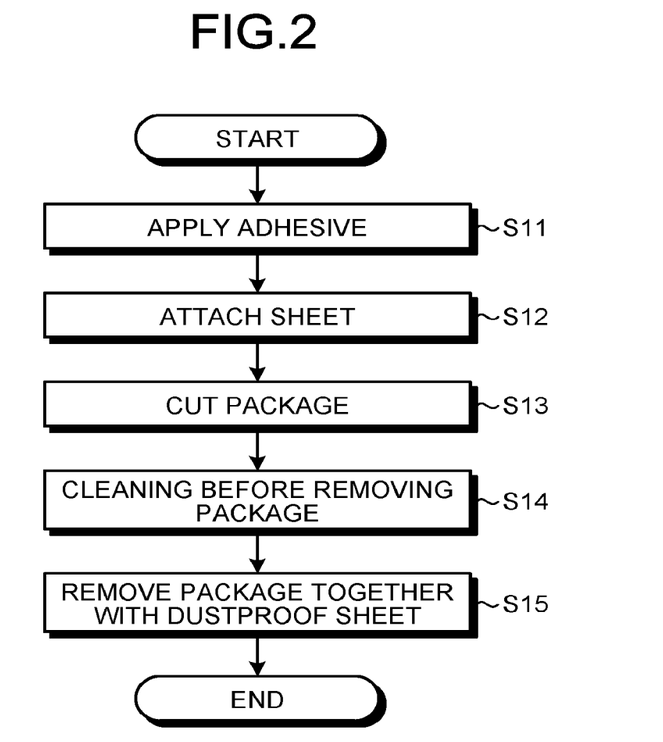
FIG. 2 is a flowchart of a method of removing a semiconductor package according to the embodiment.

FIG. 2 is a flowchart of a method of removing a semiconductor package according to the embodiment.

The method of removing the semiconductor package includes a method of cutting the semiconductor package.

First, adhesive for attaching a dustproof sheet to the semiconductor package 12 is applied before cutting the semiconductor package 12 to be cut that is included in the electronic circuit board 10 (Step S11).

As the adhesive used for attaching the dustproof sheet, any adhesive can be used as long as the adhesive has sufficient adhesive strength such that the dustproof sheet is not to be peeled off during the cutting process and the removing process of the semiconductor package.

As the dustproof sheet, for example, a resin film having a thickness of 10 μm to 1000 μm is used. The dustproof sheet may be subjected to antistatic treatment to prevent cutting debris from adhering thereto.

Figure 3A:
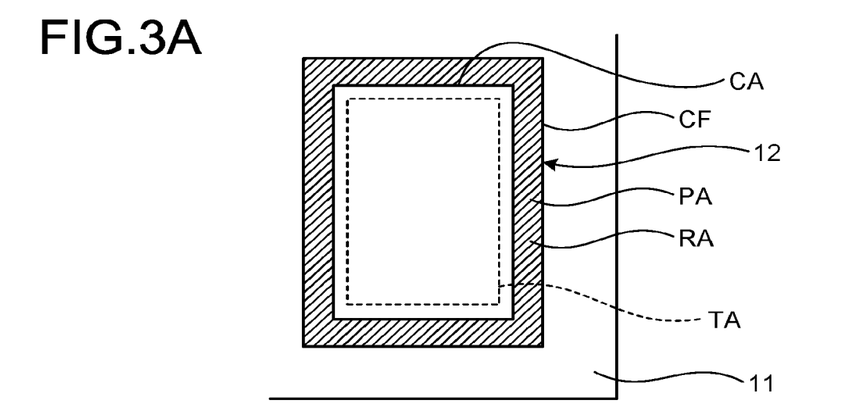
FIGS. 3A to 3C illustrate locations where an adhesive is applied according to the embodiment.
Figure 3B:
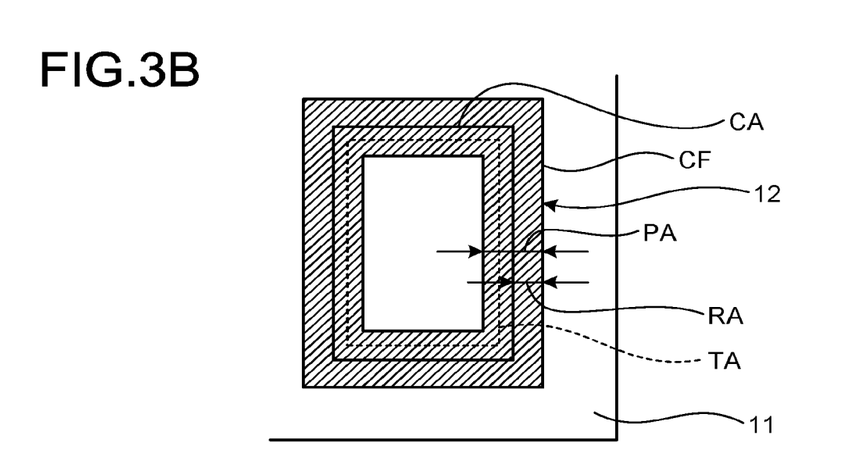
Figure 3C:
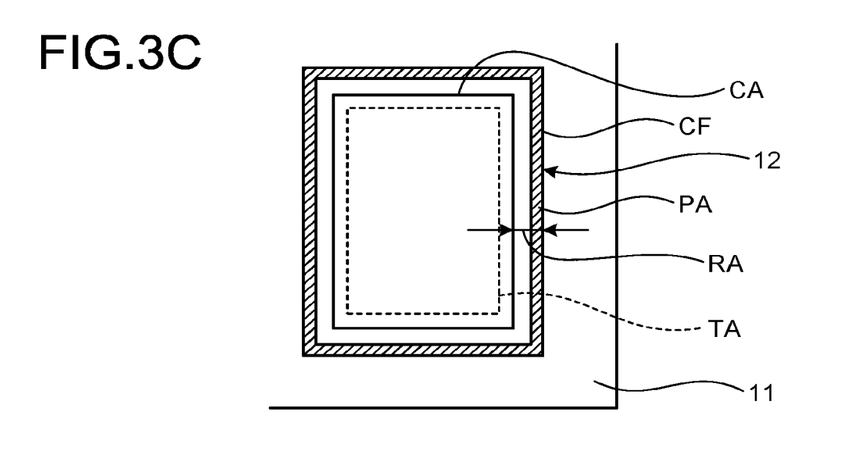

FIGS. 3A to 3C illustrate locations where the adhesive is applied.

It is assumed that the semiconductor package 12 to be cut uses plastic as a sealing material to seal the semiconductor chip.

In the present embodiment, at the time of cutting the semiconductor package, the sealing material on an outer peripheral portion of the semiconductor package 12 is left as a residual portion RA so as to form a frame-shaped wall when the semiconductor package 12 is viewed in a plan view. More specifically, when the semiconductor package 12 is viewed in a plan view, an area including the central portion of the semiconductor package 12 and surrounded by a frame line CA is a cut area. Then, the sealing material left in an area between the frame line CA and the outer periphery of the semiconductor package 12 becomes a frame shape as the residual portion RA. A terminal area TA in which solder balls as external electrode terminals are arranged may be included in the cut area.

The residual portion RA is left in a frame shape such that the cutting debris during cutting does not reach the printed circuit board 11.

In this case, the entire frame-shaped portion, which serves as the residual portion RA after cutting, may be a predetermined area PA where the adhesive is to be applied, as an example illustrated in FIG. 3A as a hatched portion in a frame shape defined by the frame line CA and an outer periphery CF of the semiconductor package 12.

In the case of FIG. 3A, the cut area defined by the frame line CA does not include an area coated with the adhesive, and an entire portion of the residual portion RA substantially matches the area coated with the adhesive.

Further, the adhesive may be applied in a frame shape not only to the portion that serves as the residual portion RA but also to an area including a position facing a part of the terminal area TA, as another predetermined area PA where the adhesive is to be applied, as illustrated as a hatched portion in FIG. 3B.

That is, in the case of FIG. 3B, a part of the area coated with the adhesive is also included in the cut area.

Further, the adhesive may be applied in a frame shape to an outer peripheral portion of the residual portion RA such that the adhesive is not applied to an inner peripheral portion of the residual portion RA, as another predetermined area PA where the adhesive is to be applied, as illustrated as a hatched portion in FIG. 3C.

That is, in the case of FIG. 3C, the outer peripheral portion of the residual portion RA is an area coated with the adhesive, and the inner peripheral portion of the residual portion RA is an area not coated with the adhesive.

In the present embodiment, the inner side of the portion coated with the adhesive is to be cut. The inner side of the portion coated with the adhesive is, among areas surrounded by the area coated with the adhesive, an area that includes the center of the semiconductor package 12. The inner side of the portion coated with the adhesive includes the following three states.

(1) When the area coated with the adhesive is in contact with an outer side of the cut area (area surrounded by the frame line CA), the entire area on the center side of the semiconductor package 12 surrounded by the area coated with the adhesive becomes the inner side of the portion coated with the adhesive.

(2) When the area coated with the adhesive is also located on the inner side the cut area, the entire area on the center side of the semiconductor package 12 surrounded by the area coated with the adhesive and a portion located inside the frame line CA in the portion coated with the adhesive become the inner side of the portion coated with the adhesive.

(3) When the area coated with the adhesive is located only at a position on the outer side (that is, the side not including the center of the semiconductor package 12) separated from the frame line CA, the entire area on the center side of the semiconductor package 12 surrounded by the frame line CA becomes the inner side of the portion coated with the adhesive.

Therefore, in any case of FIGS. 3A to 3C, the portion coated with the adhesive is not entirely cut even if the inner side of the portion coated with the adhesive is cut, the dustproof sheet LM is still attached after the cutting, and at the time of the cutting, the cutting debris does not reach the printed circuit board 11.

Figure 4:
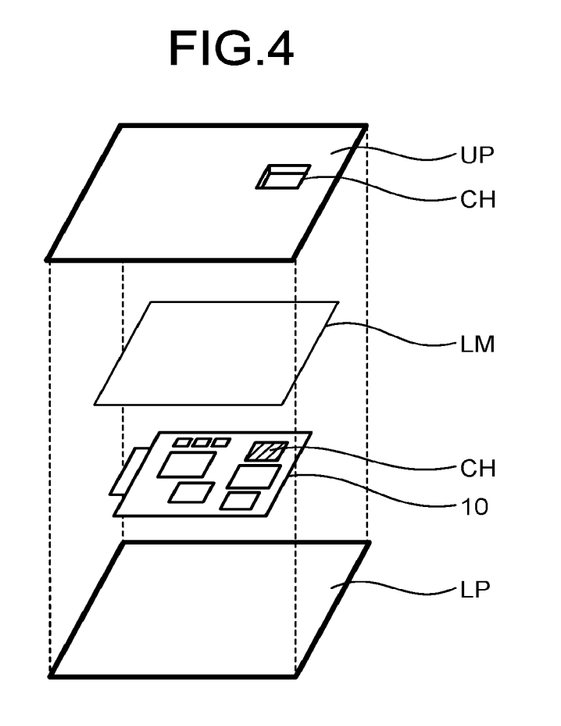
FIG. 4 illustrates a jig-fixing operation for the electronic circuit board according to the embodiment.

FIG. 4 illustrates a jig-fixing operation for the electronic circuit board.

Although the dustproof sheet LM is illustrated as separated from the electronic circuit board 10 for easier understanding of the positional relationship, the jig-fixing operation is actually performed in a state where the dustproof sheet LM is attached to the semiconductor package 12 to be cut mounted on the electronic circuit board 10.

In Step S12 (see also FIG. 2), an operator attaches the dustproof sheet LM so as to cover the entire electronic circuit board 10 and firmly adhere to a position of the semiconductor package 12 to be cut to which the adhesive is applied in Step S11.

Here, as illustrated in FIG. 4, a fixing jig includes an upper plate UP and a lower plate LP. The upper plate UP is provided with an opening CH at a position corresponding to the semiconductor package 12 to be cut so that a cutting blade can reach the semiconductor package 12 mounted on the electronic circuit board 10 through the opening CH.

The upper plate UP and the lower plate LP are then mechanically fixed so as to prevent the dustproof sheet LM from being displaced from the electronic circuit board 10 or warped.

A fixing member that fixes the upper plate UP and the lower plate LP to each other is not illustrated. Any fixing members that function in cooperation with each other may be provided on the upper plate UP and/or the lower plate LP, or a fixing member may be provided on a cutting device.

Next, the operator cuts the semiconductor package 12 (including the semiconductor chip) (Step S13).

Figure 5A:
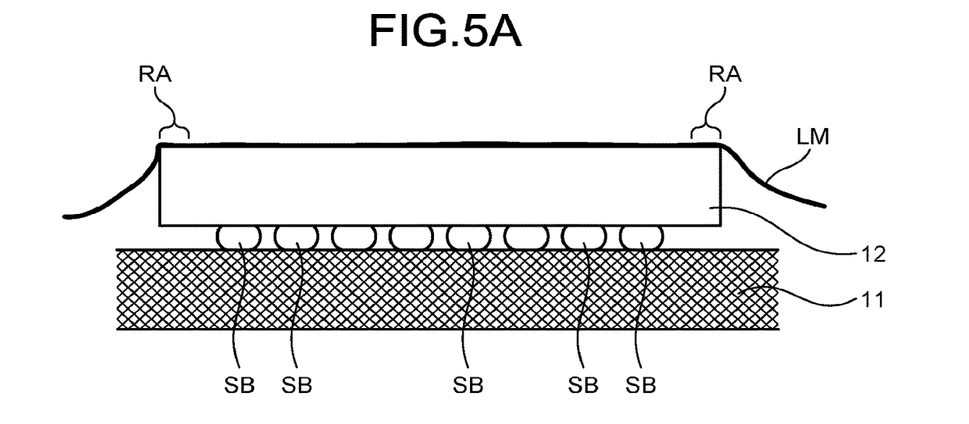
FIGS. 5A to 5C illustrate cut states of the semiconductor package according to the embodiment.
Figure 5B:
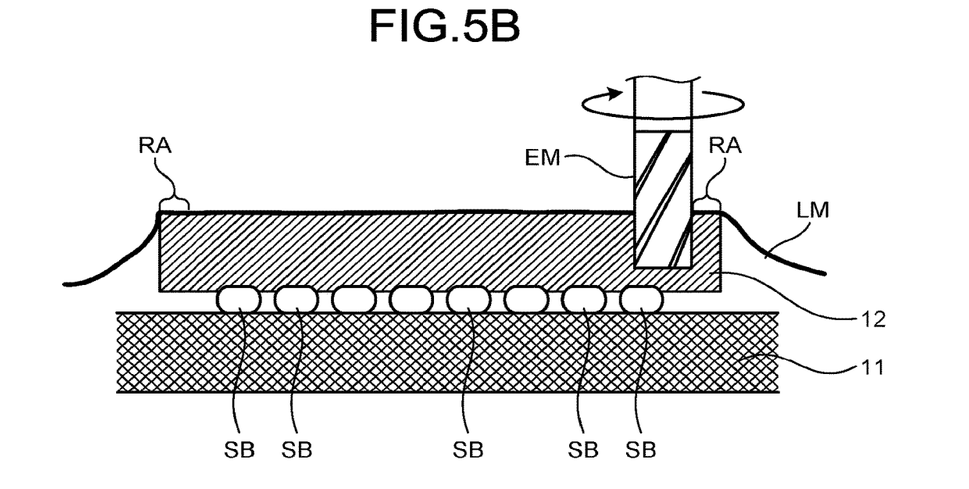
Figure 5C:
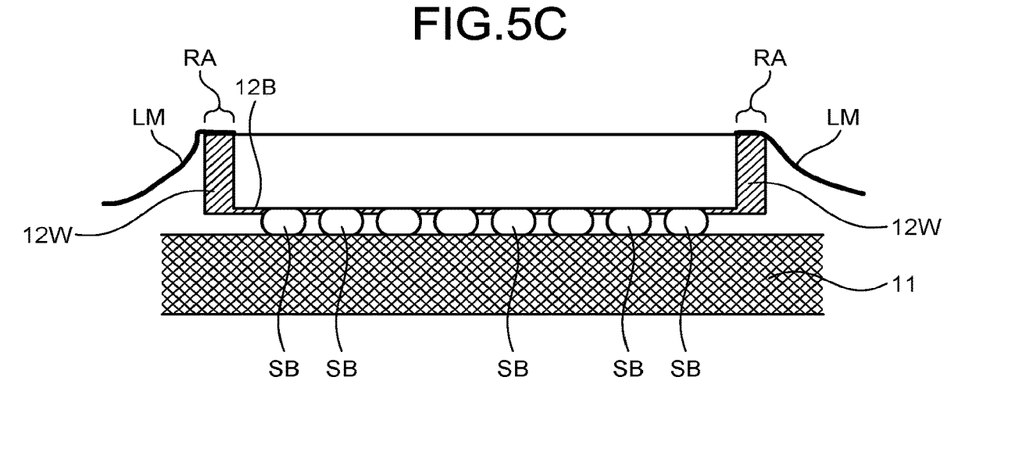

FIGS. 5A to 5C illustrate cut states of the semiconductor package.

Figure 6A:
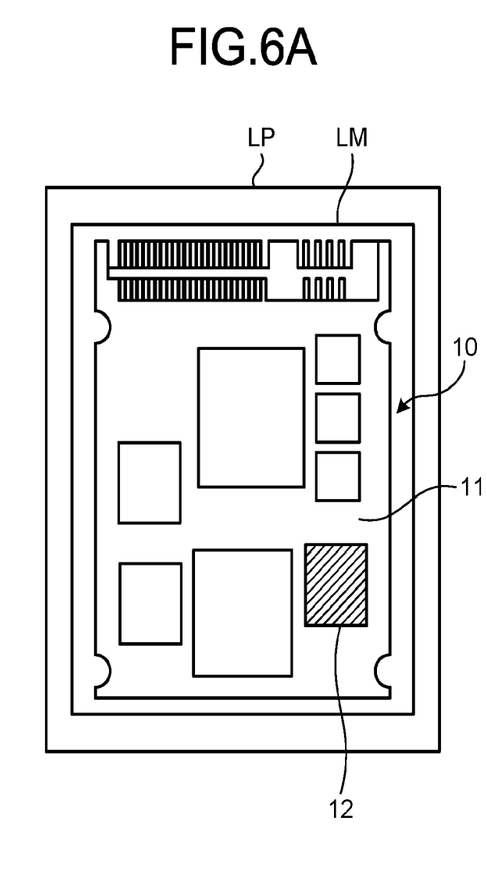
FIGS. 6A to 6C illustrate a cutting process and a removing process of the semiconductor package according to the embodiment.
Figure 6B:
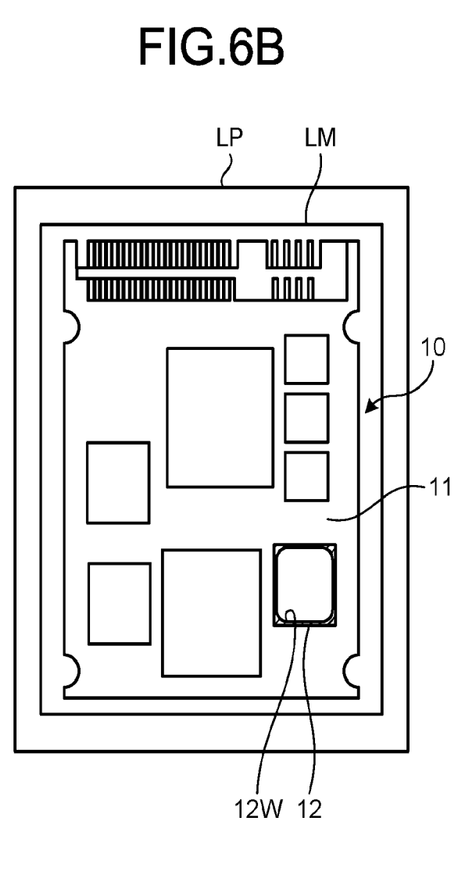
Figure 6C:
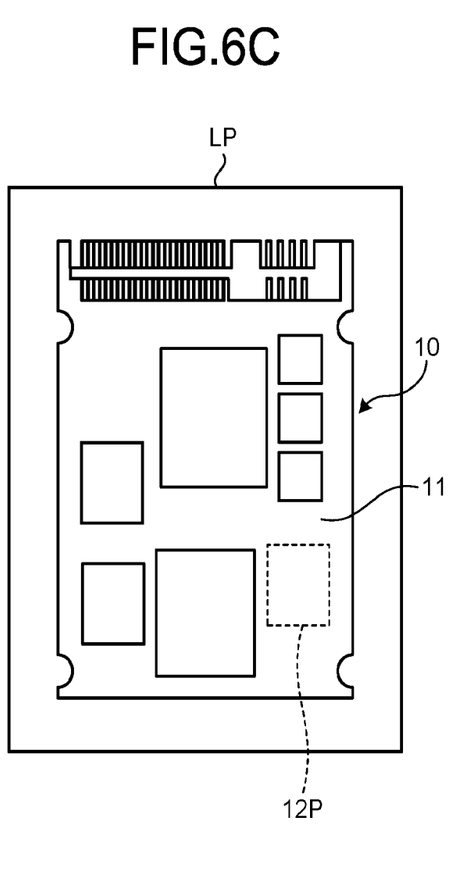

FIGS. 6A to 6C illustrate the cutting process and the removing process of the semiconductor package.

The semiconductor package 12 to be cut has a plurality of solder balls SB as external electrode terminals on the lower surface thereof. In a state before cutting, the semiconductor package 12 to be cut is soldered to electrode terminals provided on an upper surface of the printed circuit board 11 via the plurality of solder balls SB as illustrated in a side view of FIG. 5A.

The dustproof sheet LM adhesively fixed with the adhesive is located on an upper surface of the semiconductor package 12 to be cut.

In this state, the entire electronic circuit board 10 including the semiconductor package 12 to be cut is covered with the dustproof sheet LM as illustrated in FIG. 6A.

The operator then cuts the semiconductor package 12 by bringing a blade of an end mill, which is an example of the cutting device, into contact with the upper surface of the semiconductor package 12 as illustrated in FIG. 5B.

In this case, it is preferable that the blade of the end mill descends to a cutting completion position that is near an upper end of the solder ball SB and where a bottom portion 12B of the sealing material of the semiconductor package 12 is likely to remain as illustrated in FIG. 5C.

The reason why the blade of the end mill descends to the position near the upper end of the solder ball SB is that it may take a longer time to melt the solder ball SB after cutting by the end mill if the sealing material of the semiconductor package 12 above the upper end position of the solder ball remains much.

Further, the reason why the bottom portion 12B of the sealing material of the semiconductor package 12 is likely to remain is that the cutting debris may reach the printed circuit board 11 and eventually, other electronic components such as a lower surface of the semiconductor package 13 not to be cut if a hole is opened in the sealing material.

The sealing material and the semiconductor chip at the cut position are scraped off at completion of the cutting as illustrated in FIG. 5C. Here, it is preferable that the semiconductor package 12 includes only the sealing material that forms a wall portion 12W, the sealing material that forms the bottom portion 12B, and the solder balls SB.

In this state, the dustproof sheet LM is still stuck to an upper surface of the wall portion 12W as illustrated in FIG. 5C.

That is, the upper surface of the semiconductor package 12, to which the dustproof sheet LM is adhered, is provided with a hole formed by cutting as illustrated in FIG. 6B. That is, the semiconductor package 12, i.e. the electronic component is cut such that at least a part of an outermost periphery the attached dustproof sheet LM remain uncut.

The operator then performs cleaning before removing the package such as suction cleaning to reduce or eliminate the influence of the cutting debris at the time of removing the semiconductor package 12 after cutting (Step S14).

Next, the operator releases the mechanical connection of the semiconductor package 12 after cutting with respect to the printed circuit board 11 with a heating device such as a soldering iron while the dustproof sheet LM is still stuck to the upper surface of the wall portion 12W of the semiconductor package 12. Then, as illustrated in FIG. 6C, the semiconductor package 12 is detached from the printed circuit board 11, and further, the sealing material of the semiconductor package 12 is removed from the printed circuit board 11 together with the attached dustproof sheet LM (Step S15).

As described above, a semiconductor package removing process including the semiconductor package cutting process and the package removing process is completed.

The case where the plastic is used as the sealing material of the semiconductor package has been described above. For ceramic or metal as the sealing material, it is also possible to use a plurality of types of end mill blades and use different blades to cut the sealing material and the semiconductor chip inside the sealing material in the cutting process of Step S13. This enables the semiconductor package to be cut more cleanly and quickly.

Figure 7:
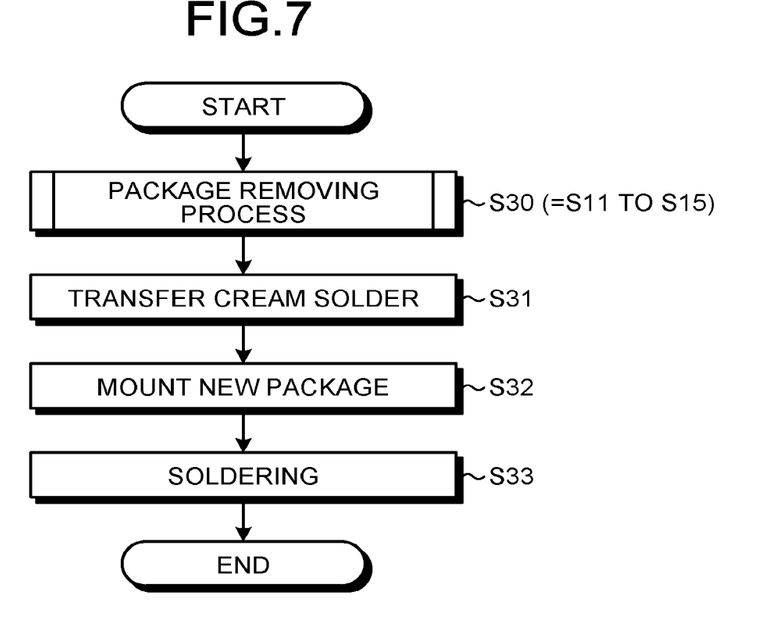
FIG. 7 is a flowchart of a method of manufacturing an electronic device according to the embodiment.

FIG. 7 is a flowchart of a method of manufacturing an electronic device.

When the electronic device 100 including the electronic circuit board 10 is manufactured by reworking of a semiconductor package, first, the above-described semiconductor package removing process (Steps S11 to S15 in FIG. 2) is performed (Step S30).

Next, the operator transfers cream solder to electrodes on the printed circuit board 11 using a stencil in accordance with the same principle as the silk screen (Step S31).

Next, the operator mounts a new semiconductor package to a position where the cream solder has been transferred on the printed circuit board 11 (Step S32).

Next, the operator performs soldering of the component mounted on the printed circuit board 11 (Step S33), whereby this rework process ends. In this manner, the electronic device 100 is manufactured.

As described above, a component can be removed without a complicated jig even for a printed circuit board having no under fill, according to the present embodiment. Further, the component can be removed while preventing cutting debris from remaining on the surface of the printed circuit board or entering a gap between the surface of the printed circuit board and the lower surface side of a mounted semiconductor package.

Furthermore, a new electronic device can be manufactured by arranging a new component in place of the removed component, and soldering and mounting the new component.

Although a semiconductor package has been taken as an example of an electronic component to be cut in the above description, the same can be applied to other electronic components.

Although the case of applying adhesive in a frame shape to attach a dustproof sheet has been described in the above description, it is also possible to apply the adhesive to the entire top surface of a component to be removed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of cutting an electronic component mounted on a circuit board, the method comprising:
   applying adhesive to a predetermined area including at least an outermost peripheral portion of an upper surface of the electronic component, and attaching a dustproof sheet to the upper surface of the electronic component; and
   cutting the electronic component while maintaining a state where the dustproof sheet is attached to the outermost peripheral portion, wherein an inner side of a portion coated with the adhesive is cut.

2. The method according to claim 1, wherein
   in the attaching the dustproof sheet, the adhesive is applied in a frame shape, and
   in the cutting the electronic component, an inner side of the frame shape of the adhesive is cut.

3. The method according to claim 1, wherein
   in the cutting the electronic component, different cutting blades are used depending on a material of the electronic component at a location to be cut.

4. The method according to claim 1, wherein
   in the cutting the electronic component, the electronic component is cut while leaving the outermost peripheral portion.

5. The method according to claim 1, wherein
   the electronic component is sealed with a sealing material, and
   in the cutting the electronic component, an outermost peripheral portion of the sealing material is left as a wall.

6. A method of removing an electronic component comprising:
the method of cutting the electronic component according to claim 1; and
removing the electronic component from the circuit board together with the dustproof sheet in a state where the dustproof sheet is attached to the outermost peripheral portion.

7. The method according to claim 1, wherein the electric component includes a ball grid array (BGA) package.

8. The method according to claim 1, wherein the electric component is soldered to an upper surface of the circuit board via a plurality of solder balls.

9. The method according to claim 1, wherein in the applying adhesive, the adhesive is applied to an entire top surface of the electronic component.

10. A method of cutting an electronic component mounted on a circuit board, the method comprising:
applying adhesive to a predetermined area including at least an outermost peripheral portion of an upper surface of the electronic component, and attaching a dustproof sheet to the upper surface of the electronic component; and
cutting the electronic component while maintaining a state where the dustproof sheet is attached to the outermost peripheral portion,
wherein
the electronic component is sealed with a sealing material, and
in the cutting the electronic component, an outermost peripheral portion of the sealing material is left as a wall.

11. The method according to claim 10, wherein
in the cutting the electronic component, different cutting blades are used depending on a material of the electronic component at a location to be cut.

12. The method according to claim 10, wherein
in the cutting the electronic component, the electronic component is cut while leaving the outermost peripheral portion of the upper surface of the electronic component.

13. A method of removing an electronic component comprising:
the method of cutting the electronic component according to claim 10; and
removing the electronic component from the circuit board together with the dustproof sheet in a state where the dustproof sheet is attached to the outermost peripheral portion of the upper surface of the electronic component.

14. The method according to claim 10, wherein the sealing material is plastic.

15. A method of manufacturing an electronic device that includes a circuit board and an electronic component mounted on the circuit board, the method comprising:
applying adhesive to a predetermined area including at least an outermost peripheral portion of an upper surface of the electronic component, and attaching a dustproof sheet to the upper surface of the electronic component;
cutting the electronic component while maintaining a state where the dustproof sheet is attached to the outermost peripheral portion;
removing the electronic component from the circuit board together with the dustproof sheet in a state where the dustproof sheet is attached to the outermost peripheral portion;
removing a residue at a mounting position of the removed component; and
arranging and mounting a new component at the mounting position.

16. The method according to claim 15, wherein
in the attaching the dustproof sheet, the adhesive is applied in a frame shape, and
in the cutting the electronic component, an inner side of the frame shape of the adhesive is cut.

17. The method according to claim 15, wherein
in the cutting the electronic component, different cutting blades are used depending on a material of the electronic component at a location to be cut.

18. The method according to claim 15, wherein
in the cutting the electronic component, the electronic component is cut while leaving the outermost peripheral portion.

19. The method according to claim 15, wherein
the electronic component is sealed with a sealing material, and
in the cutting the electronic component, an outermost peripheral portion of the sealing material is left as a wall.

20. The method according to claim 15, wherein
in the cutting the electronic component, an inner side of a portion coated with the adhesive is cut.

* * * * *